(12) United States Patent
Xiong et al.

(10) Patent No.: US 6,537,428 B1
(45) Date of Patent: Mar. 25, 2003

(54) STABLE HIGH RATE REACTIVE SPUTTERING

(75) Inventors: Wei Xiong, Hauppauge, NY (US); Subhadra Gupta, Valley Cottage, NY (US)

(73) Assignee: Veeco Instruments, Inc., Plainview, NY (US)

( * ) Notice: Subject to any disclaimer, the term of this patent is extended or adjusted under 35 U.S.C. 154(b) by 0 days.

(21) Appl. No.: 09/389,861

(22) Filed: Sep. 2, 1999

(51) Int. Cl.$^7$ ............................................. C23C 14/35
(52) U.S. Cl. ........................ 204/192.13; 204/192.16; 204/298.03; 204/298.08; 204/298.07; 204/192.22; 204/192.15; 204/192.23; 204/192.26
(58) Field of Search ................ 204/192.13, 192.15, 204/298.03, 298.08, 298.07, 192.22, 192.23, 192.26

(56) References Cited

U.S. PATENT DOCUMENTS

| | | | | |
|---|---|---|---|---|
| 4,894,132 A | * | 1/1990 | Tanaka .................. | 204/298.03 |
| 5,108,569 A | * | 4/1992 | Gilboa et al. .......... | 204/192.16 |
| 5,439,574 A | * | 8/1995 | Kobayashi et al. .... | 204/192.13 |
| 5,556,520 A | * | 9/1996 | Latz ....................... | 204/192.13 |
| 5,942,089 A | * | 8/1999 | Sproul et al. .......... | 204/192.16 |

OTHER PUBLICATIONS

Affinito and Parsons, "Mechanisms of Voltage Controlled, Reactive, Planar Magnetron Sputtering of Al in Ar/N$_2$ and Ar/O$_2$ Atmospheres", Journal of Vacuum Science Technology, A 2(3), Jul.–Sep., 1984, pp. 1275–1284.

McMahon et al., "Voltage Controlled, Reactive Planar Magnetron Sputtering of AlN Thin Films", Journal of Vacuum Science Technology, 20(3), Mar., 1982, pp. 376–378.

Rossnagel et al., Handbook of Plasma Processing Technology, Noyes Publications, NJ, USA, 1989, pp. 233–259.

\* cited by examiner

*Primary Examiner*—Mark F. Huff
*Assistant Examiner*—Daborah Chacko Davis
(74) *Attorney, Agent, or Firm*—Morgan & Finnegan, L.L.P.

(57) ABSTRACT

A method and apparatus for monitoring and controlling reactive sputter deposition, particularly useful for depositing insulating compounds (e.g., metal-oxides, metal-nitrides, etc.). For a given nominal cathode power level, target material, and source gases, the power supplied to the cathode (target) is controlled to stabilize the cathode (target) voltage at a specified value or within a specified range corresponding to a partial pressure or relative flow rate value or range of the reactive gas. Such an operating point or range, characterized by a specified voltage value or range and corresponding reactive gas relative-flow/partial-pressure value or range, may be determined empirically based on measuring the cathode voltage as a function of reactive gas relative-flow/partial-pressure for the given nominal power. This relationship is typically a hysteresis curve, and preferably the operation point is selected at or near the hysteresis transition edge to provide high rate deposition of high quality films, including insulating or dielectric films using a metallic target.

19 Claims, 3 Drawing Sheets

STABLE HIGH RATE REACTIVE SPUTTERING

BACKGROUND OF THE INVENTION

1. Technical Field

The present invention relates generally to sputtering, and more particularly to a reactive sputtering method and system for stabilizing the reactive sputtering process through sputter power control to balance the arrival and removal rates of reactive species at target surface for high-rate deposition of dielectric films.

2. Background Art

Dielectric and other non-conducting films are widely used in a broad range of applications such as semiconductor chips, magnetic and optical recording, flat panel displays, ink jet printer heads, solar cells, integrated optics, optical coatings, etc. Traditional deposition methods like RF diode and RF magnetron sputtering using a dielectric target have been well established and commonly used by the industries. However, their extremely low deposition rate prevents high-throughput production. Further, excessive substrate heating and poor thickness uniformity are normally associated with RF diode processes.

As an alternative, reactive sputtering which involves sputtering a metallic (elemental) target in Ar—O2 or Ar—N2 gas mixtures offers a much higher deposition rate, good film uniformity, as well as cooler substrate temperatures. In particular, the high deposition rate near the metal mode is very attractive for mass production of dielectric films. However, high-rate reactive sputtering near the metal mode is usually very unstable due to the poisoning of the target by the arriving oxygen or nitrogen. This can be described by the hysteresis curve that characterizes the deposition rate versus the flow rate of oxygen or nitrogen gas. To form dielectric films at high rate, reactive sputtering has to operate near or on the sharp falling edge of the curve. Any deviation from the equilibrium between the arrival and removal rates of oxygen at the target surface tends to escalate rapidly and result in a drastic drift towards the unwanted metal mode or the low-rate oxide mode. To prevent the drifting and hence stabilize the process, instant and effective response to any rate imbalance is mandatory.

Partial pressure control is the primary method used to maintain the stability of the reactive sputtering process. Any changes in oxygen or nitrogen partial pressures would impact the poisoning rate of the target and the combination rate with the metallic atoms to form oxide or nitride. This in turn affects many parameters like sputter voltage, discharge, current, intensity of plasma emission and optical emission from Al2O3 formation. Therefore, these parameters are often used as a monitor to control the feedback loop of partial pressure adjustment.

Due to the "inertia" associated with pressure changes, partial pressure control appears not fast enough to correct the instability buildup during the deposition process. Too radical adjustment of partial pressure tends to overshoot and cause instability in the opposite direction. Moreover, the precision of partial pressure control may not be sufficient enough to match the subtle deviation from the balanced operating state. Other approaches include low-frequency modulation of discharge current and even pulsed DC power, but they are unable to follow the instant and random fluctuations near the operating point.

It may be appreciated, therefore, that further advancements and improvements in reactive sputter deposition are needed, particularly for providing effective an reliable stabilization of high-rate reactive sputtering for continuous deposition of dielectric films, and for providing instantaneous and precise response to any fluctuations that might cause instability of the sputter process.

SUMMARY OF THE INVENTION

The present invention provides such advancements and overcomes the above mentioned problems and other limitations, by providing a reactive sputtering processing system and method that controls power supplied to the cathode to stabilize the cathode voltage. For a given nominal cathode power level, target material, and source gases, the power supplied to the cathode (target) is controlled to stabilize the cathode (target) voltage at a specified value or within a specified range corresponding to a partial pressure or relative flow rate value or range of the reactive gas. Such an operating point or range, characterized by a specified voltage value or range and corresponding reactive gas relative-flow/partial-pressure value or range, may be determined empirically based on measuring the cathode voltage as a function of reactive gas relative-flow/partial-pressure for the given nominal power. This relationship is typically a hysteresis curve, and preferably the operation point is selected at or near the hysteresis transition edge to provide high rate deposition of high quality films, including insulating or dielectric films using a metallic target.

In accordance with an aspect of the present invention, a nominal flow rate or partial pressure of a reactive gas is established in a reactive sputter deposition system. The cathode voltage is stabilized at a nominal voltage by adjusting the power supplied to the cathode, wherein the nominal voltage and nominal flow rate or partial pressure of the reactive gas are determined according to an equilibrium state or steady state condition among the cathode voltage, the nominal flow rate or partial pressure of the reactive gas, and the power supplied to the cathode.

In accordance with a further aspect of the invention, the cathode voltage is stabilized at a nominal voltage by adjusting the power supplied to the cathode to balance the arrival and removal rate of said reactive species at the target.

BRIEF DESCRIPTION OF THE DRAWINGS

Additional aspects, features, and advantages of the invention will be understood and will become more readily apparent when the invention is considered in the light of the following description made in conjunction with the accompanying drawings, wherein.

DETAILED DESCRIPTION OF THE INVENTION

The method and associated apparatus of the present invention are designed to control and preferably optimize the conditions (e.g., kinetics) for interaction between atomized target material and reactive gas (e.g., balance the arrival and removal rates of reactive species at the target, which also relates to the reaction of the atomized target material and reactive species in the plasma/glow discharge) in a sputtering system such that a high quality compound film may be deposited at high deposition rates and/or to large thicknesses.

Figure 1:
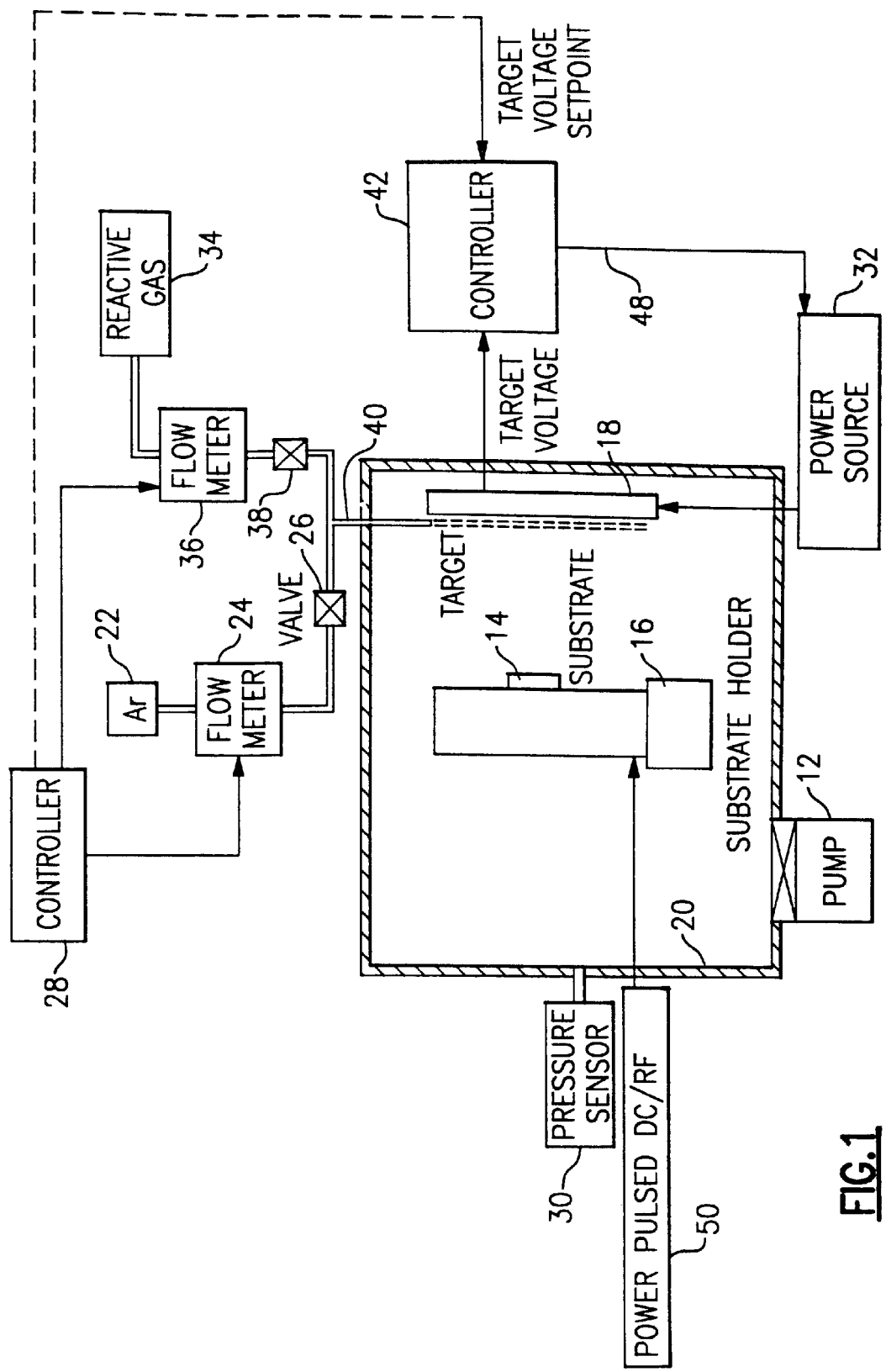
FIG. 1 schematically depicts component parts of a sputtering system which may be used to practice the present invention.

Referring to FIG. 1, there is schematically depicted component parts of a sputtering system which may be used to practice the invention. A vacuum chamber 10 is evacuated by a pump 12 after a substrate material 14 (e.g., quartz, steel, silicon wafer, thin film magnetic head substrate, etc.) is mounted on a holder 16 within the chamber 10. A target material 18 (e.g., aluminum or some other metal, semiconductor, or other non-insulating material) is also mounted within the chamber 10. The target 18 serves as a cathode in the process, and the inside walls 20 of chamber 10 serve as an anode. Preferably, as known in the art the cathode is implemented as a magnetron structure (not shown). During processing, a radio frequency (RF) bias (or, for example, pulsed DC) may be applied by substrate power source 50 to the substrate 14 to enhance the film deposition process, as is known in the art.

A non-reactive gas (e.g., inert gas, shown as argon (Ar)) is admitted to chamber 10 from a source 22 via a flow meter 24 (e.g., mass flow controller), shut-off valve 26, and conduit 40. A reactive gas (e.g., oxygen, nitrogen, methane, ammonia, carbonaceous gases such as acetylene, etc.) is provided from a source 34 through a flow meter 36 (e.g., mass flow controller), shut-off valve 38, and also via conduit 40. In this embodiment, the gases are admitted in the vicinity of the target 18 where proximity of the resulting reactive species (e.g., ions, radicals, atomic components of the reactive gas, resulting from excitation of the precursor reactive gas) to atoms from the target will enhance reaction therewith. In alternative embodiments, the non-reactive gas and the reactive gas may be admitted via separate conduits to separate locations in the chamber. Shut-off valves 26 and 38 are not used to meter the flow rate into the chamber, but are used to selectively isolate the flow meters from the chamber if necessary (e.g., maintenance). Controller 28 (e.g., a personal computer under programmatic control) provides designated flow setpoints (e.g., based on an operator specified process) to flow meters 24 and 36 (e.g., mass flow controllers), which incorporate their own controllers to maintain the specified flow rate. In various embodiments of the present invention, controller 28 may also specify a target voltage setpoint to controller 42, as will be further understood below.

A power source 32 provides power to target 18 (e.g., by an electrically conductive connection of a cathode terminal/conductor to the target, the target thus acting as part of the cathode when so connected). In a preferred embodiment of the present invention, power source 32 provides a nominally constant, direct current (DC) power to target 18, and also preferably includes a high frequency current polarity reversal technique to eliminate arcing. Alternative implementations of the present invention may employ pulsed or RF power as the power source 32, such target power supply techniques being generally known in the art.

Accordingly, in accordance with the basic, well-known operation of a reactive sputtering process, reactive and non-reactive gases flow into the chamber, and power supplied to the cathode provides an electric potential between the cathode and the anode, thus generating a plasma/glow discharge in the chamber, the plasma including various species resulting from the reactive gas (referred to herein as "reactive species", e.g., for oxygen, these reactive species may include oxygen ions, oxygen radicals, atomic oxygen) as well as various species resulting from the non-reactive gas (referred to herein as "non-reactive species"; e.g., for the inert gas Ar, these non-reactive species may include argon ions and radicals). Species (ions) bombarding the target release target atoms by momentum transfer (hence the typically more massive non-reactive species being more effective in yielding sputtered target atoms), and the released target atoms react with reactive species in the plasma to produce a compound (e.g., metal oxide) that becomes deposited onto the substrate (and other surfaces). Notably, such deposition can also occur on the target and further, reactive species can react with the target material at the target surface to form the compound on the target (e.g., oxidize the target). Such compound deposition and formation at the target is well recognized as a primary problem in reactive sputtering, and is particularly a problem in reactive sputtering of non-insulating (e.g., conductive or semiconductive) targets to produce substantially non-conducting (e.g., very low conductivity or insulating or dielectric) compounds.

In accordance with the present invention, the power source 32 is effectively responsive to the sensed cathode (target) voltage which is input to a controller 42 which, upon proper processing, provides a control signal via link 48 to power source 32. The target voltage may be sensed by various known techniques applicable to the type of power source 32 employed (i.e., constant DC, pulsed DC, or RF). Additionally, the power supply itself may include appropriate circuitry for sensing its output/load voltage (i.e., the target (cathode) voltage) as well as discharge current, and may further include digital and/or analog output representing the sensed target voltage, which output may be provided to controller 42. As used herein, sensing or measuring the target (or cathode) voltage is not limited to directly measuring the actual magnitude of the target (cathode) voltage signal itself but includes measuring or providing a signal representative of the target voltage (e.g., having a known or determinable relationship thereto, such as some linear or non-linear relationship).

More specifically, in accordance with the present invention, controller 42 provides a control signal to power source 32 to adjust the power provided to target 18 such that the target (cathode) voltage is maintained at a specified constant value or within a certain specified voltage range. For a given target material and reactive process gas, this constant value or voltage range is determined based on a calibration and process development procedure as follows.

Figure 2:
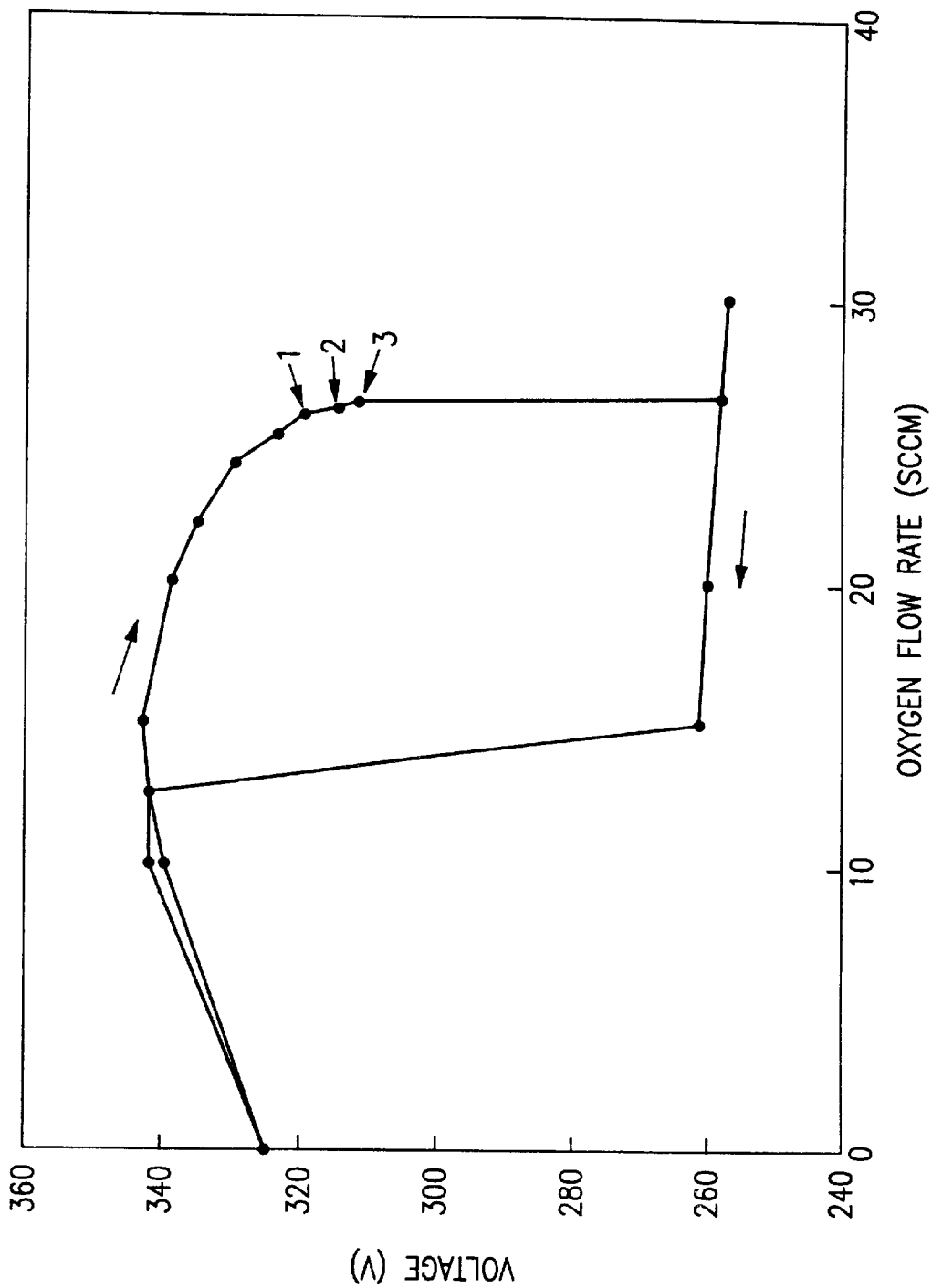
FIG. 2 is a measured hysteresis curve of reactive sputtering of alumina, in accordance with implementing sputter power control according to the present invention.

First, for a given nominal power supplied to the target, the cathode voltage is measured as a function of reactive gas flow percentage (or correspondingly, cathode voltage as a function of reactive gas partial pressure). For deposition of a non-conducting or insulating compounds using a conductive or non-insulating target, this relationship of voltage vs. reactive gas flow percentage is typically characterized by (i) a low slope, higher voltage region over a lower reactive gas flow percentage range, and (ii) a low slope, lower voltage region over a higher reactive gas flow percentage range, with (iii) a high slope transition between these two regions. The low slope, higher voltage region generally corresponds to metallic or metallic-rich deposition and higher deposition rates, whereas the low slope, lower voltage region generally corresponds to non-conductive (e.g., insulating) compound deposition and low deposition rates. Additionally, as is understood in the art, this relationship also typically exhibits hysteresis due to the oxide formation on the target. FIG. 2 depicts such a hysteresis curve measured at a nominal cathode power of 5 KW, using an aluminum target and argon and oxygen gases totalling a volumetric flow rate-of 200 sccm.

Second, using the measured relationship (hysteresis curve) between voltage and relative reactive gas flow, one or more preferred operating points or ranges may be determined from various selected/desirable points or local regions on the curve defined by this relationship. These preferred operating points (i.e., each operating point constituting a nominal setpoint voltage and relative reactive gas flow) or ranges may be determined by characterizing films deposited using sputter power control to stabilize the target voltage at each of the various selected/desirable points or local regions on the hysteresis loop (each point also characterized by a corresponding reactive gas relative flow that is established in the sputtering system). Generally, the various selected/desirable points are usually close to where the voltage drops sharply from the metallic to the fully reactive state on the target surface. At lower oxygen flow rates away from the transition point the film might be partially metallic (absorbing), while it is usually nearly impossible to achieve stability at or along the transition zone with traditional partial pressure or flow control. At higher oxygen flow rates away from the sharp decreasing transition region, the deposition rate is very low and therefore this region is generally undesirable. Thus previous efforts have focused primarily on artificial reduction of the arrival rate by using various geometrical arrangements (such as getter meshes), pulsed plasma processing or rotational mode sputtering to flatten the slope of the hysteresis loop with some effort directed at stabilizing the critical point by using partial pressure control. In accordance with the present invention, however, sputter power control provides instant and effect response to correct any shift in cathode voltage during the process and hence can maintain the process stability at any point on any hysteresis loop, thus allowing the desirable regions at the sharp transition to be tested and used. Characterization of the films may involve measuring and/or analyzing, for example, modulus, hardness, refractive index, extinction coefficient, relative dielectric permittivity, depth uniformity of characteristics such as chemical composition, uniformity of characteristics across the substrate.

This procedure of hysteresis curve measurement and film deposition and characterization may be repeated for various nominal powers. Generally, higher nominal powers will provide higher deposition rates but also require higher reactive gas flow percentage (i.e., higher reactive gas partial pressure) to operate at the generally desirable high slope edge of the hysteresis curve. Accordingly, one or more processes (i.e., nominal power, reactive gas partial pressure value or range, cathode voltage value or range) may be selected based on considerations such as deposited film characteristics, reproducibility, throughput, yield, as well as system maintenance requirements (e.g., downtime, which may affect throughput and/or cost). It is also noted that because the cathode voltage characteristics with respect to a given process may drift over time for various cathode types, periodic calibration (e.g., using hysteresis curve measurement and film deposition and characterization) may preferably be implemented to ensure process reliability and reproducibility.

Controller 42 may be implemented in various ways, including as analog and/or digital circuitry, as a programmed microcontroller, a programmed digital computer (e.g. personal computer or workstation) with data acquisition and control interfaces. The desired nominal cathode voltage setpoint for a given process may be provided to controller 42 by, for example, a separate controller (e.g., controller 28), analog and/or digital setpoint circuitry (e.g., using a potentiometer manually set by an operator), or where controller 42 is a programmed digital computer may, for example, be pre-stored for various pre-stored, selectable processes or specified by via a user interface (e.g., keyboard). Since control may simply be based on the difference between the sensed cathode voltage and a nominal setpoint, a PID (proportional-integral-derivative) controller is well suited for such control. Also, it may be understood that controller 42 may be incorporated into the power supply itself, for example as the feedback circuitry in a regulated power source (e.g., a regulated switchmode power supply) or into the program of a microcontroller controlled power supply. Generally, any such control is simplified by a feature of the present invention, discussed further below, which feature is that not only does the cathode voltage respond rapidly to changes in the sputtering conditions, but also the sputtering conditions change rapidly in response to changes in power supplied to the target (cathode). It is noted that such a feature combined with the precision (e.g., sub-Watt adjusting resolution during nominally KW level runs) and flexibility of adjusting sputter power make it easy to accurately correct even very subtle changes in the cathode voltage without overshoot.

In accordance with a further embodiment of the present invention, it may be understood that the hysteresis curve information may also be used to more rapidly stabilize process conditions upon start-up. For example, upon start-up, once the desired gas flow rate is set, the initial nominal power to the cathode may be rapidly increased and adjusted to the nominal power setting for the equilibrium condition associated with the operating point.

It is also noted that implementing controller 42 as a programmed digital computer is well suited for incorporating additional process monitoring and control (i.e., in addition to sensing the cathode voltage and controlling power supplied to the cathode) into an overall, single process control system. Such additional monitoring and control may include for example, (i) monitoring the chamber pressure provided by pressure sensor 30, (ii) monitoring the partial pressure of the reactive and inert gases sensed by instrument(s) such as a mass spectrometer, residual gas analyzer, or optical gas sensor, iii) dynamically (i.e., in process) controlling the flow of reactive gas based on the sensed partial pressure and/or the cathode voltage. In this regard, where controller 42 is a programmed digital computer, it may embody all the functionality of controller 28 (i.e., establishing set points for flow meters 24 and 26), and thus controller 28 need not be implemented as a separate controller.

Qualitatively, target power controlled reactive sputtering in accordance with the present invention may be understood as follows. Considering an initial operating point (i.e., initial reactive gas partial pressure and initial cathode voltage) within a portion of the high slope transition edge of a hysteresis curve (voltage vs. reactive gas partial pressure) at a given power, if the reactive gas partial pressure increases (decreases) incrementally and the power remains the same, then the voltage will decrease (increase) and the current will increase (decrease). These changes in sputtering conditions generally represent increasing (decreasing) oxidation (for convenience it is assumed that the reactive gas is an oxidizing species) of the target as, for example, (i) the increased (decreased) reactive species partial pressure provides increased (decreased) oxidizing species at the target, (ii) the oxidized target regions generally have a lower sputter yield at a given voltage compared to non-oxidized target regions, (iii) the reduced (increased) voltage results in a reduced (increased) sputter yield (removal rate) of the oxidized target portions, and (iv) the reduced (increased) voltage also results in a reduced (increased) sputter yield (removal rate) of the non-oxidized portions, thus effectively increasing the reactive species partial pressure by providing less (more) elemental target species to react (e.g., combine to form the deposited compound) with the reactive species in the plasma/glow discharge and/or substrate region. Now, increasing the power to restore the initial voltage will tend to reverse the increase (decrease) in target oxidation because (i) the higher (lower) voltage increases (decreases) the sputter yield of the oxidized target regions, (ii) the higher (lower) voltage also increases (decreases) the sputter yield of the non-oxidized target regions (assuming incremental changes in the oxide coverage and that the electric field distribution between oxidized and non-oxidized regions does not change substantially as a result of such incremental changes in the oxide coverage), thus effectively decreasing (increasing) the reactive species partial pressure by providing more (less) target atoms to react with reactive species in the plasma/glow and substrate regions.

It is noted that this qualitative description of the power control mechanism is merely set forth as a simple, heuristic model to facilitate an appreciation of various important features of the present invention; as is understood by those skilled in the art, actual reactive sputtering dynamics and control thereof involves detailed analysis of many coupled complex physical/chemical interactions at the target, in the plasma/glow discharge, and at the substrate. Nevertheless, from this simple, heuristic model, it may be appreciated that, in accordance with the present invention, power control provides rapid, direct, and sensitive control over the sputtering dynamics so that these conditions may be maintained within an optimum or desired range. Further, also in view of this qualitative description of the power control, the power control based on cathode voltage feedback may be viewed not only as tending to maintain the sputtering conditions near the high-rate portion of the hysteresis curve transitions for a range of powers, but also as tending to provide a negative feedback to the etching kinetics to maintain steady-state etching conditions (e.g., oxide formation and removal at the target). Accordingly, it is also appreciated that the present invention features not only sensing a signal (i.e., a signal representing the cathode voltage) that responds directly and precisely to changes in the etching conditions, but also controlling a signal (cathode power) that directly and precisely controls the sputtering conditions.

The following example of experimental results obtained in developing and implementing an alumina reactive sputter deposition process in accordance with the hereinabove described embodiments is merely provided by way of example to illustrate features and characteristics of the present invention, which is not to be construed as being limited thereby.

EXAMPLE

The hysteresis curve shown in FIG. 2 was measured for a nominal DC power of 5 KW, and a total volumetric gas flow rate (i.e., argon and oxygen) of 200 sccm, using a Veeco Instruments Cymetra™ sputtering system. This system included separate gas rings for O2 and argon to minimize the poisoning of target surface by oxygen. In addition, a choke-off plate was placed between the target and substrate to reduce the arrival rate of metallic atoms sputtered off the target and reaching the substrate. Moreover, a rotating magnetron magnet pack, such as the RMX™ type cathode, was used to ensure full-face erosion on the target surface and hence to minimize target poisoning due to oxygen in areas of low or zero sputtering. Further an ENI RPG-100 power supply (which is a DC power supply with high frequency current polarity reversal capability) capable of pulsing at frequencies up to 200 kHz was used in conjunction with an Advanced Energy SPARC-LE-20 arc suppression unit to minimize arcing due to target oxidation. In FIG. 2, the voltage values at the high slope transition edge represent the maximum voltage measured over a stable operating interval after conditions have been equilibrated at the desired oxygen flow, although other techniques may be used (e.g., averaging).

After measuring the hysteresis curve, for each of the operating points 1, 2, and 3 in FIG. 2, an alumina film was deposited to a thickness greater than 5 μm by setting the appropriate oxygen flow rate specified by the operating point and by using sputter power control to maintain the cathode voltage sensed by the power supply at the nominal voltage specified by the operating points. Table 1 lists refractive index, extinction coefficient, and deposition rate compared to pure metal rate (i.e. rate of pure aluminum under the same conditions) for several points labeled on the curve shown in FIG. 2, clearly demonstrating that high reactive sputter deposition rates comparable to metal rates have been achieved for continuous deposition of dielectric $Al_2O_3$ films.

| Operating Point | Voltage (V) | Refractive Index $N_f$ @ 630 nm | Extinction Coefficient | Deposition Rate (% of metal rate) |
| --- | --- | --- | --- | --- |
| 1 | 320 | 1.64 | 0 | 62.8% |
| 2 | 315 | 1.64 | 0 | 52.1% |
| 3 | 312 | 1.64 | 0 | 46.5% |

Figure 3:
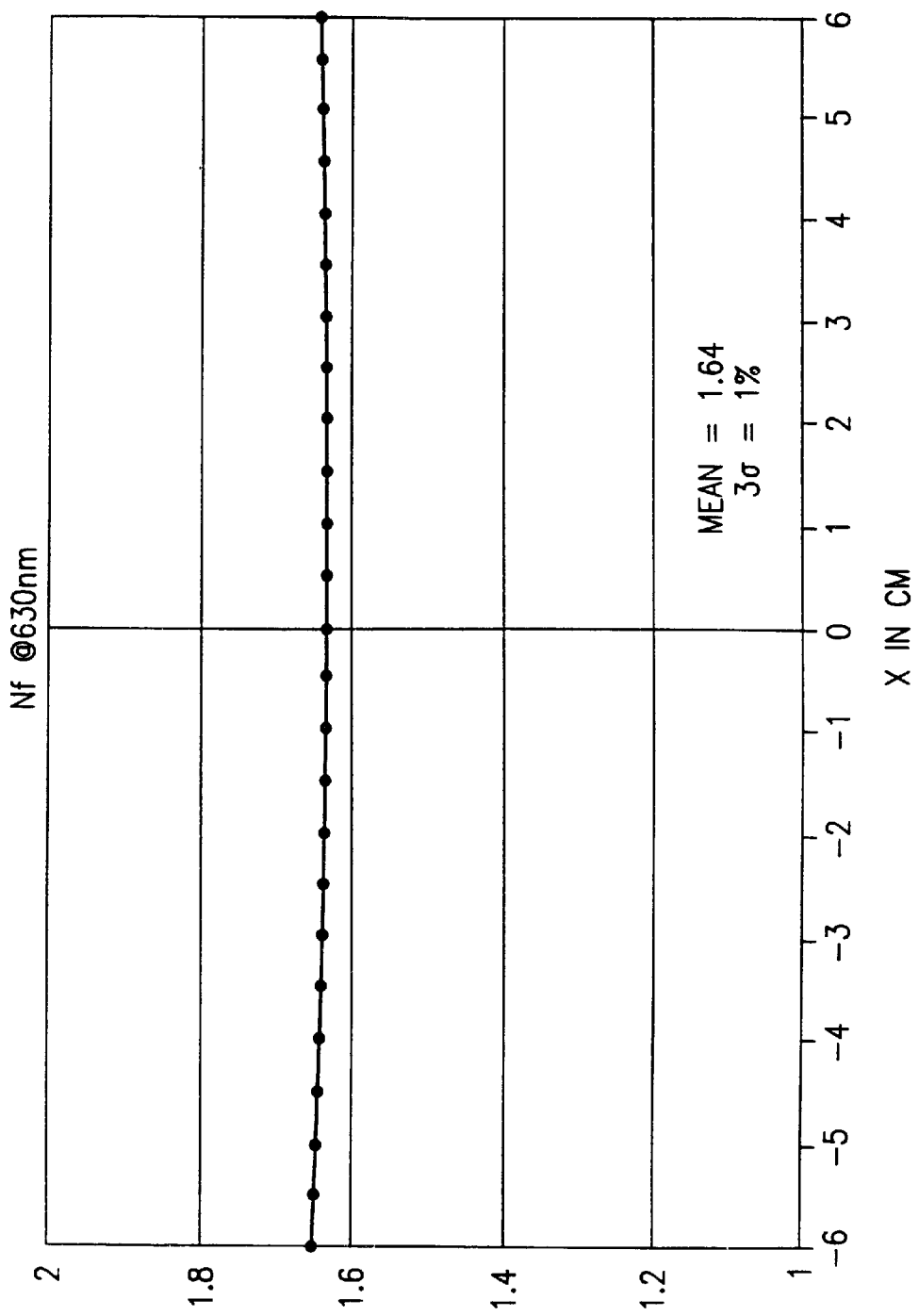
FIG. 3 is a plot showing the index of refraction of alumina, deposited in accordance with the present invention, measured across a five inch diameter wafer.

FIG. 3 shows the uniformity of the measured refractive index ($N_f$ at 630 nm) for these deposited $Al_2O_3$ films over a 5-inch diameter range, clearly indicating that a high uniformity of 1% (3σ) has been obtained.

The experimental results clearly show that reactive sputtering power control according to the present invention can even stabilize a process running on the sharp falling side of the hysteresis loop. It is noted that during deposition of these films, the power supply output typically varied only several watts to control the cathode voltage. It is noted that in other experiments, not described here, a nominally KW range power supply output varied as much as about 200 watts to maintain control of the cathode voltage at a point on the sharp edge of the hysteresis curve; however, high quality films were also obtained.

As mentioned, the above-described embodiments and examples are merely illustrative of the present invention, which is not limited thereto. For instance, it may be appreciated that the schematic sputtering system of FIG. 1 is merely illustrative, and the present invention may be practiced with myriad reactive sputter system designs and configurations. For example, chamber 10 may instead be at ground potential, and a separate anode provided within the chamber. Also, the non-reactive (e.g., inert) gas may be injected into the chamber separately from the reactive gas and away from the target. Additionally, it may be appreciated that the present invention may be implemented by adapting conventional, commercial sputtering systems to include feedback of the target (cathode) voltage for adjusting the power supplied to the target to stabilize the target voltage at an appropriate specified level (i.e., corresponding to a desired point or range on the hysteresis loop). Further, although the hysteresis curve shown in FIG. 2 was measured with respect to volumetric flow rate of oxygen for a constant total volumetric flow rate of oxygen and argon, similar hysteresis curves may be measured with respect to oxygen partial pressure by using, for example, a mass spectrometer or residual gas analyzer.

Moreover, although the present invention is particularly well suited for depositing insulating or non-conductive compounds, it may also be applied to depositing conductive compounds (e.g., indium tin oxide (ITO)). Also, while the foregoing illustrative example demonstrated alumina deposition, and some other target materials and gas sources have been mentioned, the present invention is not limited by these particular target materials and gas sources. By way of example only, some additional target materials may include titanium, tantalum, zinc, hafnium, zirconium, chromium, silicon and mixtures thereof. Various combinations of these target materials with various reactive gas sources may be used to deposit myriad oxides, nitrides, carbides, sulfides, fluorides, chlorides, borides, and mixtures thereof. For example, some additional useful materials that may be deposited in accordance with the present invention include $Ta_2O_5$, TiN, $Si_3N_4$, SiC, and ZnO.

Although the above description provides many specificities, these enabling details should not be construed as limiting the scope of the invention, and it will be readily understood by those persons skilled in the art that the present invention is susceptible to many modifications, adaptations, and equivalent implementations without departing from this scope and without diminishing its attendant advantages. It is therefore intended that the present invention is not limited to the disclosed embodiments but should be defined in accordance with the claims which follow.

We claim:

1. A method for controlling a sputter deposition process involving reaction between a reactive species and a material included in a target acting as a cathode, said method comprising the steps of:

establishing a reactive sputter deposition process at an approximate operating point corresponding to an approximate cathode voltage of said cathode, a given flow rate or partial pressure of a reactive gas, and a given power supplied to said cathode, wherein said approximate operating point corresponds to a transition region between a low slope metal mode and a low slope compound mode of a hysteresis curve that represents the voltage of said cathode as a function of the flow rate or partial pressure of said reactive gas for said given power supplied to said cathode; and stabilizing the reactive sputter deposition at said approximate operating point by adjusting the power supplied to said cathode to maintain said approximate cathode voltage of said cathode.

2. The method according to claim 1, wherein said target is electrically conducting and a compound formed from the reaction is electrically non-conducting.

3. The method according to claim 1, wherein the sputter deposition of a compound onto a substrate is at a rate at least about 50% of a rate of deposition of the target in a metal mode corresponding to operating without the presence of said reactive gas at substantially the same power conditions.

4. The method according to claim 1, wherein said target is a material selected from the group consisting of aluminum, titanium, tantalum, zinc, hafnium, zirconium, chromium, silicon and mixtures thereof.

5. The method according to claim 1, wherein said compound is selected from the group consisting of oxides, nitrides, carbides, sulfides, fluorides, chlorides, borides, and mixtures thereof.

6. The method according to claim 1, wherein said approximate cathode voltage and said approximate flow rate or partial pressure of the reactive gas or reactive species are selected to provide desired characteristics of a film formed by said reactive sputter deposition.

7. The method according to claim 1, wherein said power supplied to the cathode is non-pulsed, direct current power, or pulsed power, or RF power.

8. The method according to claim 1, wherein said step of establishing reactive sputter deposition includes initially stabilizing the reactive sputter deposition process conditions by establishing said approximate flow rate or partial pressure of the reactive gas; and applying an initial power determined according to said operating point.

9. A method for controlling a sputter deposition process involving reaction between a reactive species and a material included in a target acting as a cathode, said method comprising the steps of:

initiating a reactive sputter deposition process at a given flow rate or partial pressure of the reactive species; and stabilizing the voltage of said cathode at an approximate cathode voltage by adjusting the given power supplied to the cathode to balance the arrival and removal rate of said reactive species at the target, wherein said given flow rate or partial pressure of the reactive species, said approximate cathode voltage, and said given power correspond to a transition region between a low slope metal mode and a low slope compound mode of a hysteresis curve that represents the voltage of said cathode as a function of the flow rate or partial pressure of said reactive species for said given power supplied to said cathode.

10. A reactive sputter deposition apparatus, comprising:

a vacuum chamber;

an anode;

a reactive gas source that provides a reactive gas into the vacuum chamber, the reactive gas characterized by a given partial pressure in the chamber or given flow rate into the chamber;

a target as a cathode in the vacuum chamber and including a material to be combined with reactive species corresponding to the reactive gas to form a compound;

a power source electrically coupled to said target such that said target may be selectively powered by the power source to excite the reactive gas to generate the reactive species that combine with the material of the target to form the compound;

a control device that senses a signal representative of the voltage at said cathode and provides a control signal to said power source such that the power supplied to the cathode is adjusted to stabilize the cathode voltage at an approximate voltage, wherein said approximate voltage and said given flow rate or given partial pressure of the reactive gas correspond to a transition region between a low slope metal mode and a low slope compound mode of a hysteresis curve that represents the cathode voltage as a function of the flow rate or partial pressure of the reactive gas at a given power supplied by said power source to the cathode.

11. The reactive sputter deposition apparatus according to claim 10, wherein said target is electrically conducting and said compound is electrically non-conducting.

12. The reactive sputter deposition apparatus according to claim 10, wherein the deposition of said compound onto a substrate is at a rate at least about 50% of a rate of deposition of the target in a metal mode corresponding to operating without the presence of said reactive gas at substantially the same power conditions.

13. The reactive sputter deposition apparatus according to claim 10, wherein said power source is a non-pulsed, direct current power source.

14. A reactive sputter deposition apparatus, comprising:
a vacuum chamber;
an anode;
a reactive gas source that provides a reactive gas into the vacuum chamber, the reactive gas characterized by a given partial pressure in the chamber or given relative flow rate into the chamber;
a target as a cathode in the vacuum chamber and including a material to be combined with reactive species corresponding to the reactive gas to form a compound;
a power source electrically coupled to said target such that said target may be selectively powered by the power source;
a control device that senses a signal representative of the voltage at said cathode and provides a control signal to said power source such that the power supplied to the cathode is adjusted to balance the arrival and removal rate of said reactive species at the target to stabilize deposition of the compound on a transition region between a low slope metal mode and a low slope compound mode of a hysteresis curve that represents the voltage of said cathode as a function of the flow rate or partial pressure of said reactive species at a given power supplied to said cathode.

15. A reactive sputter deposition apparatus, comprising:
a vacuum chamber;
an anode;
a reactive gas source that provides a reactive gas into the vacuum chamber, the reactive gas characterized by a given partial pressure in the chamber or given relative flow rate into the chamber;
a target as a cathode in the vacuum chamber and including a material to be combined with reactive species that correspond to the reactive gas to form a compound;
a power source electrically coupled to said target such that said target may be selectively powered by the power source;
means for controlling the power source to stabilize deposition of the compound on a transition region between a low slope metal mode and a low slope compound mode of a hysteresis curve that represents the voltage of said cathode as a function of the flow rate or partial pressure of said reactive species at a given power supplied to said cathode.

16. The reactive sputtering apparatus according to claim 15, wherein said means for controlling the power source senses a signal representative of the voltage at said cathode and provides a control signal to said power source such that the power supplied to the cathode is adjusted to balance the arrival and removal rate of said reactive species at the target.

17. The reactive sputtering apparatus according to claim 15, wherein said means for controlling the power source senses a signal representative of the voltage at said cathode and provides a control signal to said power source such that the power supplied to the cathode is adjusted to stabilize the cathode voltage of said cathode.

18. A method for controlling a sputter deposition process involving reaction between a reactive gas and a material included in a target acting as a cathode, said method comprising the steps:
sensing a signal representative of a sputter parameter that is rapidly or directly responsive to power supplied to the cathode; and
stablizing the sputter parameter by controlling the power supplied to the cathode based on the deviation between the sensed signal representative of the sputter parameter and a signal representative of the desired approximate value or range of the sputter parameter to stabalize deposition on a transition region between a low slope metal mode and a low slope compound mode of a hysteresis curve that represents the voltage of said cathode as a function of the flow rate or partial pressure of said reactive species at a given power supplied to said cathode.

19. The method according to claim 18, wherein said sputter parameter is cathode voltage.

* * * * *